(12) United States Patent
Fong et al.

(10) Patent No.: US 7,516,375 B2
(45) Date of Patent: Apr. 7, 2009

(54) METHODS AND SYSTEMS FOR REPAIRING AN INTEGRATED CIRCUIT DEVICE

(75) Inventors: David Art Fong, San Jose, CA (US); Gang Miao, Shanghai (CN)

(73) Assignee: Via Technologies, Inc., Hsin-Tien, Taipei (TW)

( * ) Notice: Subject to any disclaimer, the term of this patent is extended or adjusted under 35 U.S.C. 154(b) by 208 days.

(21) Appl. No.: 11/389,710

(22) Filed: Mar. 27, 2006

(65) Prior Publication Data

US 2007/0226556 A1    Sep. 27, 2007

(51) Int. Cl.
*G01R 31/28* (2006.01)
(52) U.S. Cl. .................... 714/724; 714/725
(58) Field of Classification Search ............. 714/710, 714/724, 733
See application file for complete search history.

(56) References Cited

U.S. PATENT DOCUMENTS

| | | | | |
|---|---|---|---|---|
| 5,270,974 A | * | 12/1993 | Reddy | 365/200 |
| 5,629,137 A | | 5/1997 | Leedy | 430/313 |
| 5,768,290 A | * | 6/1998 | Akamatsu | 714/732 |
| 6,166,559 A | * | 12/2000 | McClintock et al. | 326/10 |
| 6,397,170 B1 | | 5/2002 | Dean et al. | 703/14 |
| 6,534,785 B1 | | 3/2003 | Farnworth et al. | 257/48 |
| 6,825,052 B2 | | 11/2004 | Eldridge et al. | 438/15 |
| 6,836,146 B2 | | 12/2004 | Zimlich | 326/38 |
| 6,913,954 B2 | | 7/2005 | Kothandaraman | 438/132 |
| 7,111,213 B1 | * | 9/2006 | Dastidar et al. | 714/724 |
| 7,155,300 B2 | * | 12/2006 | Akram et al. | 700/121 |
| 7,373,567 B2 | * | 5/2008 | Cohn et al. | 714/725 |
| 2005/0144524 A1 | * | 6/2005 | Bonaccio et al. | 714/27 |
| 2005/0278588 A1 | | 12/2005 | Cohn et al. | |

* cited by examiner

*Primary Examiner*—James C Kerveros
(74) *Attorney, Agent, or Firm*—Thomas, Kayden, Horstemeyer & Risley

(57) ABSTRACT

Provided are systems for repairing an integrated circuit device. The systems include detection logic configured to locate a defective portion of an integrated circuit device, a supplemental integrated circuit component configured to functionally replace the defective portion, and logic configured to identify an interface location. Also provided are methods for repairing an integrated circuit device. The methods include the steps of: identifying a defective portion of an integrated circuit device; disconnecting existing circuit components; and incorporating a supplemental integrated circuit component with the integrated circuit device.

25 Claims, 7 Drawing Sheets

METHODS AND SYSTEMS FOR REPAIRING AN INTEGRATED CIRCUIT DEVICE

TECHNICAL FIELD

The present disclosure is generally related to integrated circuits and, more particularly, is related to methods and systems for repairing integrated circuits using supplemental integrated circuits.

BACKGROUND

Integrated circuits (ICs) are designed to include active and passive elements such as transistors, diodes, resistors, and capacitors that are interconnected in a predetermined pattern to perform desired functions. Integrated circuits and assemblies have become more complex with time. In a logic circuit, the number of integrated circuit logic units and interconnects on a given size die have been substantially increased reflecting improved semiconductor processing technology. Integrated circuits can include, for example, powerful application specific integrated circuit (ASIC) devices designed to provide a high degree of functionality for a particular device or type of application.

ASIC's are produced as logic chips designed to perform a specific function and thereby meet the specific needs of a specific application. The designs are implemented in a single silicon die by mapping functions to a set of predesigned, preverified logic circuits provided by an ASIC vendor. These circuits range from simple functions, such as inverters, NANDs, NORs, flip-flops and latches, to more complex structures such as memory arrays, adders, counters, and phase-lock loops.

Integrated circuits can also include gate arrays having transistors arrayed in rows and columns on each die. Standard processing to make such structures includes fabricating as many as a half a million transistors comprising a quarter of a million gates per die. Each transistor is provided with conductive contact points that can also be arranged in rows and columns. After subsequent processing steps, including, for example, adding conductive layers, are performed, the completed die is tested. In some circumstances, if any of the devices on the die are defective, that die will fail an exhaustive test and be scrapped. Alternatively, functional repairs are performed either by using conductive material and spare gates to reconnect non-functional logic or the die is reprocessed by adding all the required additional semiconductor and conductor layers to replace or repair the non-functional portion. All of these approaches consume significant time and financial resources.

Thus, a heretofore-unaddressed need exists in the industry to address the aforementioned, and other, deficiencies and inadequacies.

SUMMARY

Embodiments of the present disclosure provide systems and methods for repairing an integrated circuit device. Briefly described, one embodiment of a system, among others, can be implemented as a system for repairing an integrated circuit device, comprising: detection logic configured to locate a defective portion of an integrated circuit device; a supplemental integrated circuit component configured to functionally replace the defective portion; and logic configured to identify an interface location.

Embodiments of the present disclosure can also be viewed as providing methods for repairing an integrated circuit device. In this regard, one embodiment of such a method, among others, can be broadly summarized by the following steps: identifying a defective portion of an integrated circuit device by utilizing a plurality of factors to determine a location of the defective portion, the plurality of factors including: functional coverage data stored in a functional coverage database; code coverage stored in a code coverage database; and routing data stored in a routing database; identifying, utilizing at least one of the plurality of factors, at least one isolation point configured to isolate the defective portion from the integrated circuit device; identifying, utilizing the plurality of factors, a plurality of connection points configured to be electrically connected to a field-programmable-gate-array; and attaching the field-programmable-gate-array to the integrated circuit device.

Embodiments of the present disclosure can also be viewed as providing systems for repairing an integrated circuit device, comprising: means for identifying a defective portion of an integrated circuit device; means for determining disconnection points on the integrated circuit device to isolate the defective portion; and means for determining connection points on the integrated circuit device for connecting a supplemental integrated circuit component.

Embodiments of the present disclosure can further be viewed as providing systems for repairing an integrated circuit device, comprising: detection logic configured to locate a defective portion of an integrated circuit device; a supplemental integrated circuit component configured to functionally replace the defective portion; and logic configured to identify an interface location.

Embodiments of the present disclosure can further be viewed as providing methods for repairing an integrated circuit device, comprising: identifying a defective portion of an integrated circuit device; disconnecting existing circuit components; and incorporating a supplemental integrated circuit component with the integrated circuit device.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
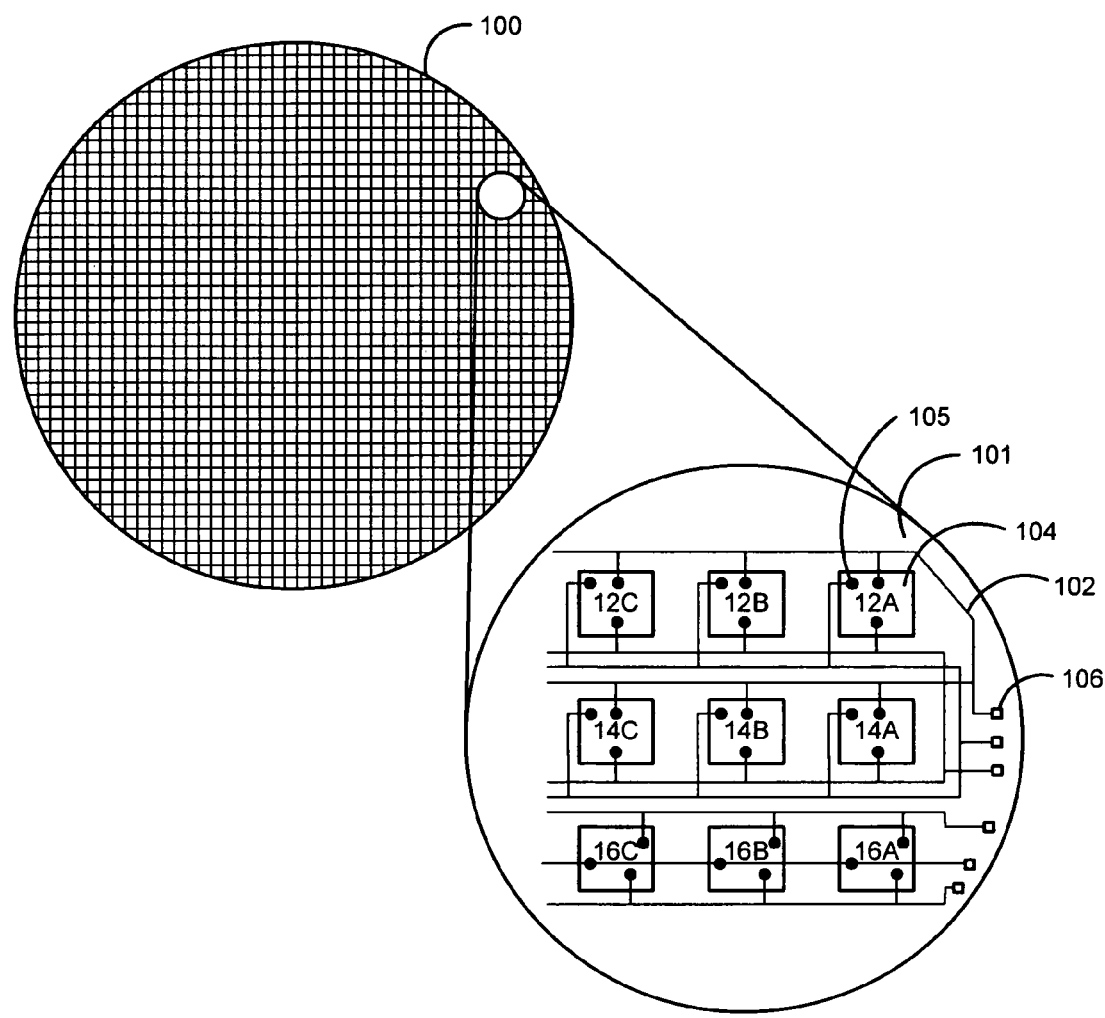
FIG. 1 is a schematic top view of an exemplary integrated circuit semiconductor die utilized under the methods and systems herein.

Having summarized various aspects of the present disclosure, reference will now be made in detail to the description of the disclosure as illustrated in the drawings. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Reference is made to FIG. 1, which is a schematic top view of an exemplary integrated circuit (IC) semiconductor die utilized under the methods and systems herein. The IC die 100 includes a substrate 101 on which numerous digital logic circuitry components 104 are installed. Probe pads 106 are positioned on the IC die 100 such that the total number of digital logic circuitry components 104 is either not reduced at all or minimally reduced due to the presence of the probe pads 106. Conductive pads 102, which can be in the form of conductive traces, connect between the probe pads 106 and the contacts 105 of the digital logic circuitry components 104.

Figure 2:
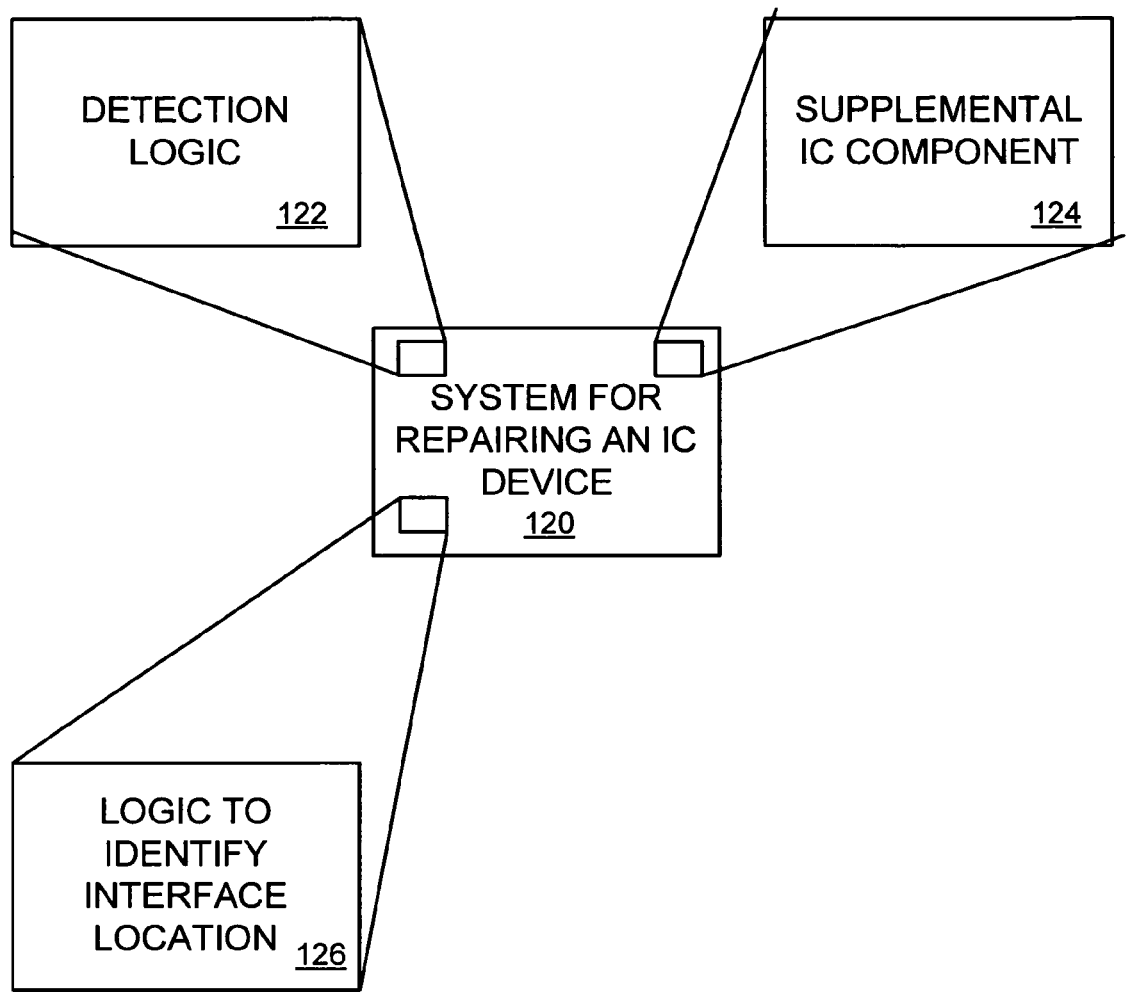
FIG. 2 is a block diagram of an exemplary embodiment of a system as disclosed herein.

Reference is now made to FIG. 2, which is a block diagram of an exemplary embodiment of a system. The system for repairing an IC device 120 includes detection logic 122 configured to locate a defective portion or portions of the IC device 120. The detection logic 122 can utilize multiple factors including, for example, functional coverage data, code coverage data, routing data, and power data, among others. Functional coverage data generally describes the functionality of the operations designed into the IC device. For example, a portion of an IC device that contains logic for performing a disproportionately large number of operations relative to other portions of the IC device is considered to have high functional coverage. Functional coverage data can be provided using, for example, a circuit analysis device or multiple assertion instructions among others. In this manner, an area having a high percentage of functionality is considered to have high functional coverage.

Code coverage data is generally determined by a measure of the effectiveness of a test program to exercise or check lines of code. For example, consider a four-line case statement such as:

```
always @(instruction)
    case (instruction)
        2'b00 : decode = 2'b000
        2'b01 : decode = 2'b001
        2'b10 : decode = 2'b010
        2'b11 : decode = 2'b011
    endcase
``` where the inputs on the instruction were only the three cases, 00, 01, and 10, and the fourth case 11 was not applied. The effective code coverage in this case would be determined as three out of four cases, or seventy-five percent (75%).

The routing describes an additional step required to provide increased accessibility without creating additional performance issues relating to timing and signal integrity. The wires are, for example, extended to make enable the antifuse to make proper connections between the different layers of conductor. The routing is performed to ensure that the antifuse layers make proper contact with the wires. The extensions, however, are not typically greater than ten percent (10%) of the total length. The routing data can generally be defined in a database or a similar data file.

Power consumption data at the die or system level is determined by measuring the voltage and current going directly into the device. The power consumption data can also be determined by a wafer supplier using an electronic design automation (EDA) tool. Locally, power consumption data can be determined by monitoring the toggling devices and measuring the switching currents in the devices. Other EDA tools are available that can be utilized to perform a power consumption analysis on a circuit with corresponding routing.

The system 120 further includes a supplemental IC component 124 configured to functionally replace the defective portion. Additionally, the system 120 includes logic to identify an interface location 126, which is configured to identify the location on the IC device where the supplemental IC component is integrated into the IC device. Additionally, the interface location can identify where the defective portion of the IC device should be isolated. The system 120 can further include a database containing performance information that corresponds to the integrated circuit device.

Figure 3:
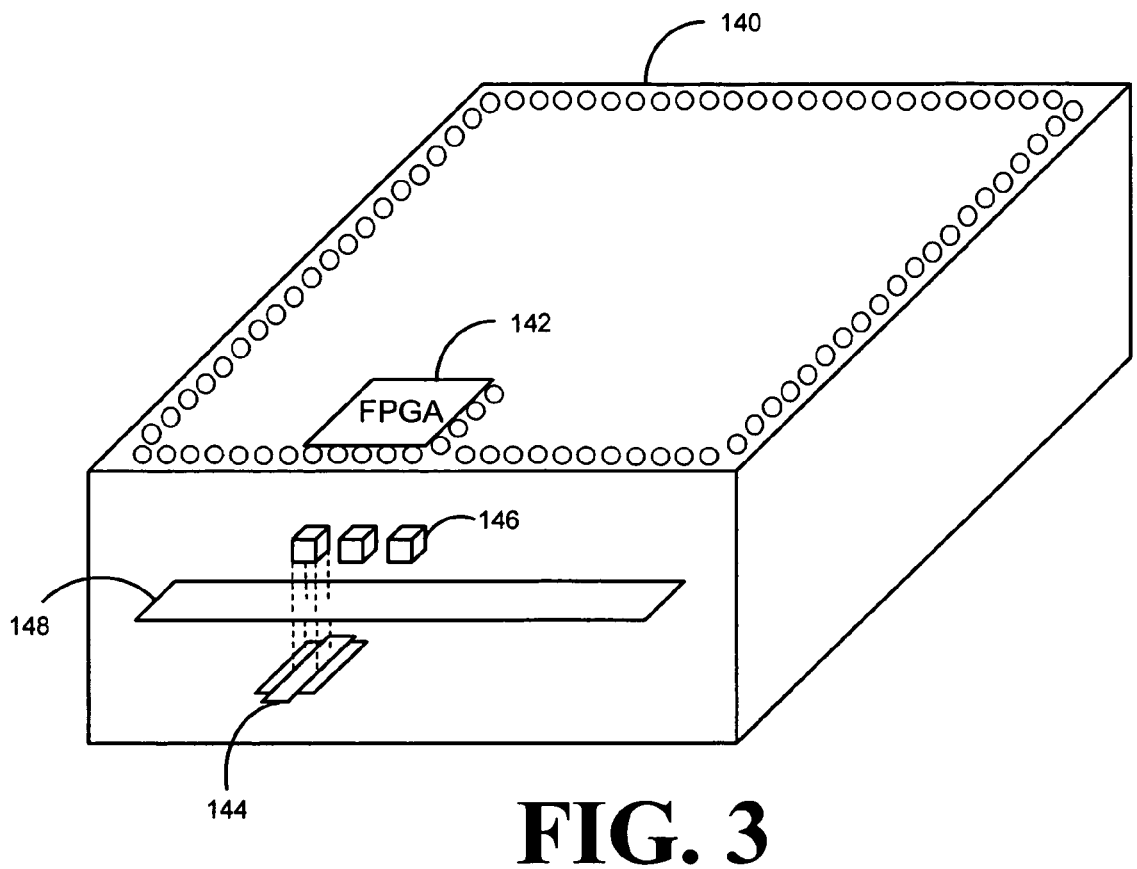
FIG. 3 is a perspective partial cut-away view of an exemplary integrated circuit semiconductor die utilizing anti-fuse techniques in conjunction with the methods and systems disclosed herein.

Reference is now made to FIG. 3, which is a perspective partial cut away view of an exemplary integrated semiconductor die utilizing antifuse techniques in conjunction with the methods and systems disclosed herein. The IC die 140 includes a large number of semiconductor gates 144. One or more antifuse layers 148, such as those required to utilize antifuse technology are included above the semiconductor gates 144. A field-programmable-gate-array (FPGA) 142 is placed on the IC die 140 and is integrated into the logic of the IC die 140 utilizing vias 146 and the antifuse material 148. The FPGA 142 can then be programmed to replace the functionality of the defective portion of the IC die 140. The antifuse material is configured to provide short circuits to create electrical connections at specifically designated points. Although the illustration of FIG. 3 only depicts a single connection, the FPGA 142 is connected to various gates 144 and the IC die 140 in order to replace the defective portion of the IC die 140.

Figure 4A:
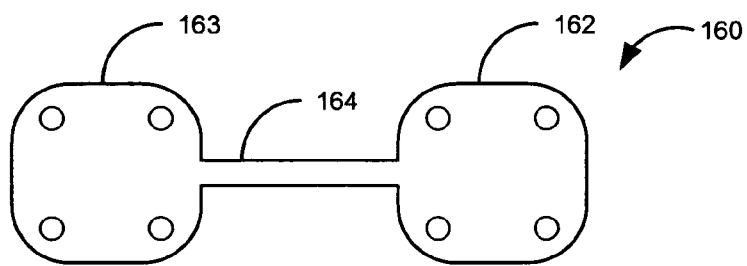
FIGS. 4A and 4B are top views illustrating exemplary fuse sections in a closed state and an opened state, respectively.
Figure 4B:
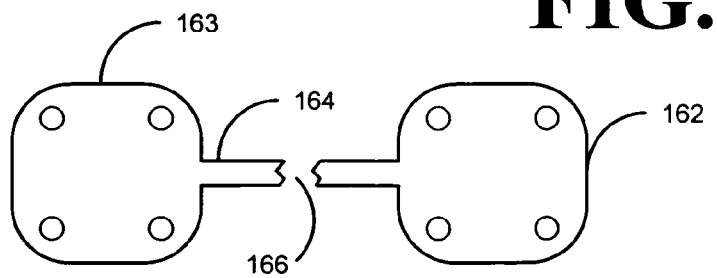

In addition to creating electrical connections by generating shorts using antifuse technology, the defective portion of the logic may also be required to be isolated from the circuitry of the IC die 140. The isolation of the defective portion may be performed utilizing one or more fuses as illustrated in FIG. 4A and FIG. 4B. FIG. 4A and FIG. 4B are top views illustrating exemplary fuse sections in a closed state and an open state, respectively. The exemplary fuse 160 includes terminals 162 and 163 connected by a link 164. As shown in FIG. 4A, the link 164 is intact and creates a closed circuit between terminals 162 and 163. Where isolation between terminals 162 and 163 is required to isolate one or more defective portions of an IC die, a portion of the link 164 may be destroyed creating a gap 166. The gap 166 creates an electrically open circuit thus electrically isolating the terminals 162 and 163. The link 164 may be destroyed using numerous methods including, but not limited to, the current generated by a voltage potential, a laser, or an antifuse related technology among others.

Figure 5:
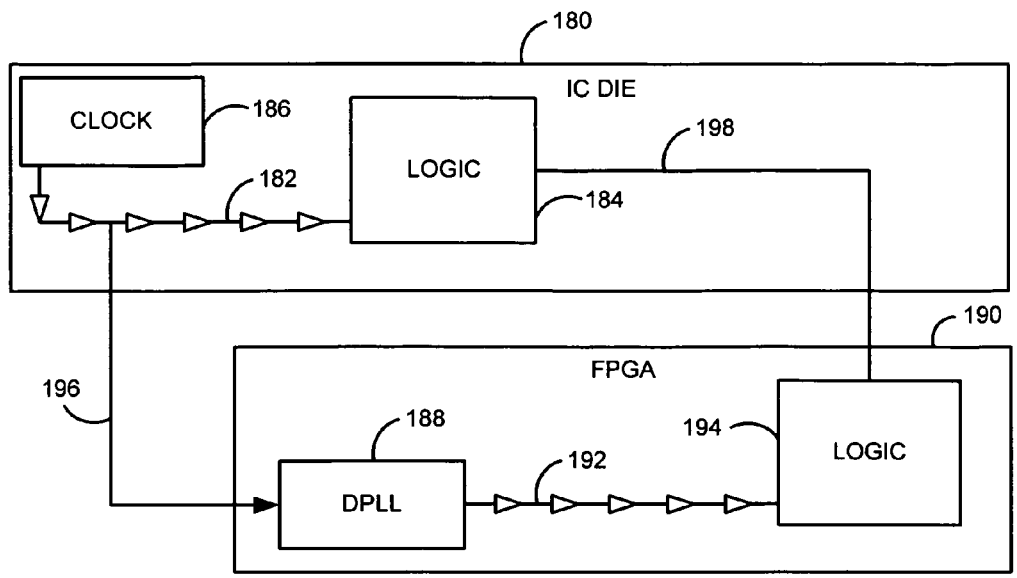
FIG. 5 is a block diagram illustrating an exemplary interface between an integrated circuit die and a supplemental integrated circuit.

Reference is now made to FIG. 5, which is a block diagram illustrating an exemplary interface between an integrated circuit die and a supplemental integrated circuit. The IC die 180 includes logic 184 that is synchronized through a clock signal 182 generated by a clock 186. The supplemental IC 190, which is illustrated as an FPGA, includes logic 194 and has an interconnection 198 with logic 184 of the IC die 180. Since the logic 194 of the supplemental IC component 190 and logic 184 of the IC die 180 are interconnected, they should be properly synchronized to avoid system timing problems for proper operation. The synchronization can be accomplished by receiving a clocking signal 196 in a digital phase locked loop (DPLL) 188 that is located within the supplemental IC 190. The digital phase lock loop 188 then generates a supplemental clocking signal 192 that is received by the logic 194. In this manner, the logic 194 is properly synchronized with the logic 184 to prevent timing related problems.

Figure 6:
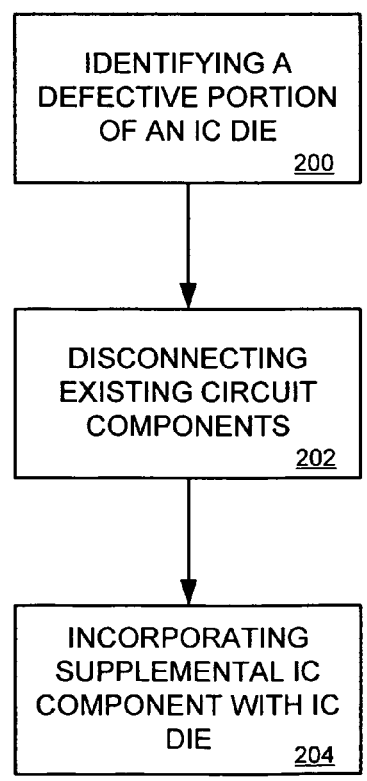
FIG. 6 is a block diagram illustrating an exemplary embodiment of a method of repairing an integrated circuit die.

Reference is now made to FIG. 6, which is a block diagram illustrating an exemplary embodiment of a method of preparing an integrated circuit die. The method begins with identifying a defective portion of an IC die in block 200. Identifying a defective portion is accomplished using, for example, multiple factors, including functional coverage data, code coverage data, routing data, and power consumption data, among others. It shall be appreciated by persons skilled in the art that a variety of data may be used to determine a location of a defective portion. Existing circuit components corresponding to the defective portion are disconnected as needed in block 202. A logic map potentially in combination with one or more of the aforementioned factors can be utilized to determine viable disconnection points. The supplemental IC component is incorporated with the IC die to replace the functionality of the defective portion in block 204. In an exemplary embodiment, the supplemental IC component is a field-programmable-gate-array (FPGA), which is incorporated and programmed to replace the functionality lost in the defective portion.

Fundamental concepts of the IC die repair include disconnecting existing defective logic also referred to as a cut, and connecting replacement logical components of a supplemental IC component, such as a FPGA. Since it would be prohibitively expensive to place the FPGA components over the whole die, it is beneficial to identify specific parameters that may determine or predict possible functional defects on the IC die. Multiple factors that can be used to determine the probable location of an FPGA to repair the IC die include, but are not limited to, code coverage, functional coverage, routing data, and, in some cases, power consumption, among others.

Figures 7, 8:
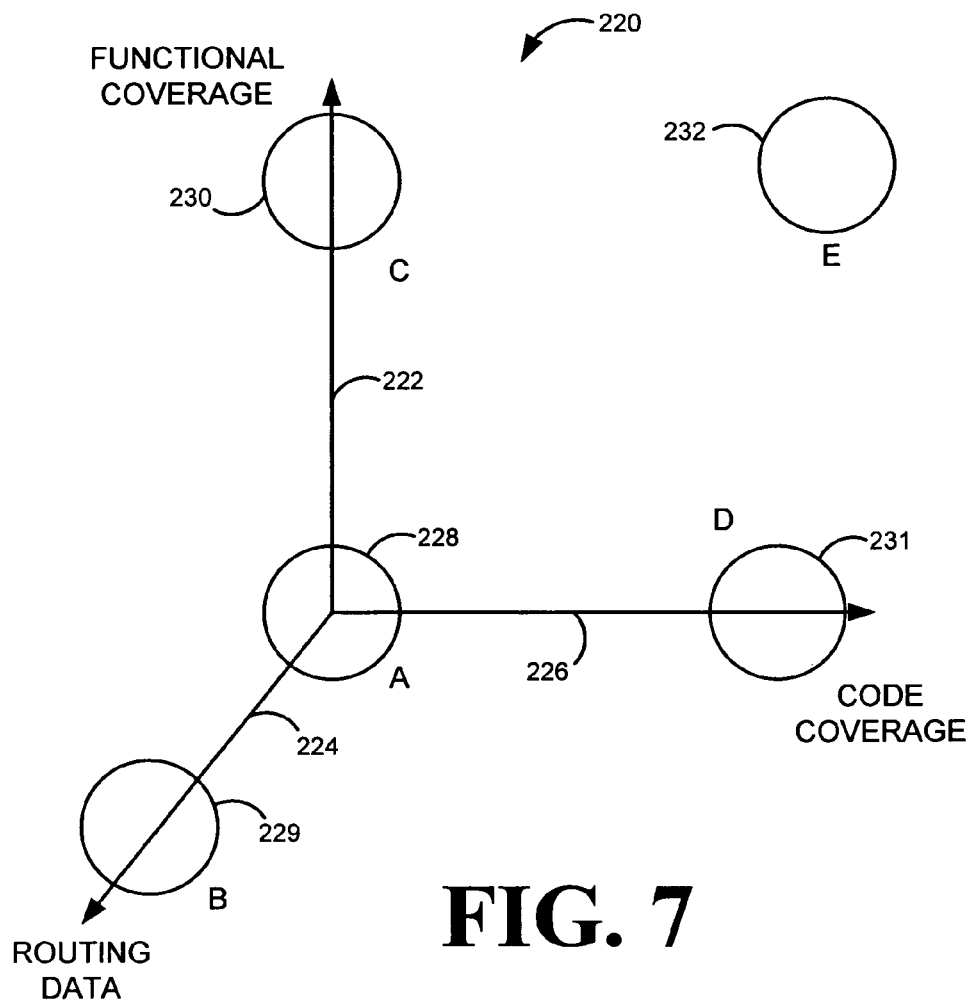
FIG. 7 is a diagram illustrating an exemplary defect analysis map.
FIG. 8 is a block diagram illustrating a table corresponding to the defect analysis diagram of FIG. 7.

Combinations of these factors can be optimally utilized in the form of a defect analysis map. Reference is made to FIG. 7, which illustrates an exemplary defect analysis map. An exemplary defect analysis map 220 utilizes a multiple-axis arrangement where each axis can represent one of the aforementioned factors. For example, there is an axis for code coverage 226, an axis for functional coverage 222, and an axis for routing data 224. Also illustrated are map zones identified as A, B, C, D, and E 228-232 that serve to better define possible conclusions based on analysis of the factors in combination as to a defect probability on the IC die. In conjunction with the defect analysis map of FIG. 7, reference is now made to FIG. 8, which is a block diagram illustrating a table corresponding to the defect analysis map of FIG. 7. The table 250 includes a zone column 252, which lists each of the map zones identified on the defect analysis map 220. A code coverage column 254 indicates a general code coverage value for each of the identified map zones. Although the exemplary code coverage values as illustrated are limited to only two points of resolution, the range of values can be defined with greater degrees of resolution within the scope and spirit of this disclosure. A functional coverage column 256 identifies general functional coverage values for each of the identified map zones and a routing data column 258 identifies general routing data values corresponding to each of the identified map zones. Like the code coverage values, the functional coverage and routing data values can also be defined with greater degrees of resolution than those illustrated. A defect probability column 260 identifies a defect probability for each of the identified zones based on the combination of the code coverage, the functional coverage, and the routing data factors.

Determining the values for the multiple factors can be accomplished through a variety of techniques. For example, code coverage data can be generated using a specially configured set of logical statements, configured to exploit the die logic. Also, a specifically configured set of branch conditional instructions can be executed in multiple permutations to discover the code coverage relative to specific functional areas of the IC die. Functional coverage can be extracted using, for example, specifically designed assertions or using a verification logic language and monitor. Routing data can be determined by analyzing a logic map and, when utilized, power consumption can be determined using electrical, electromagnetic, capacitive, or thermal monitoring techniques, among others.

In an analysis of the individual zones, zone A has low code coverage, low functional coverage, and a low routing data value. This combination of factors may indicate a higher probability of possible defects because this combination may signal that this portion of the die is low or non-functional. Zone B, which exhibits low code coverage, low functional coverage, and a high routing data value can reflect an area having a likelihood of a clocking logic defect. Zone C, which has a low code coverage and a high functional coverage, is not a viable zone since the significant functionality cannot exist absent supporting code. Another possible significance of this zone is that this condition may signal potential errors in the data from which one or more of the factors are derived. Zone D, which exhibits high code coverage and low functional coverage has a low probability of possible defects because of the correlation between code coverage and functional coverage. Zone E, which exhibits high code coverage and high functional coverage, regardless of routing data value, has very low probability of representing defective portions because a high functional coverage in a high code coverage area is correlative of properly functioning logic. An integrated circuit device location having a high probability of including the defective portion includes a portion of the integrated. circuit device corresponding to low code coverage relative to other primary integrated circuit device locations and low functional coverage relative to other primary integrated circuit device locations.

Figure 9:
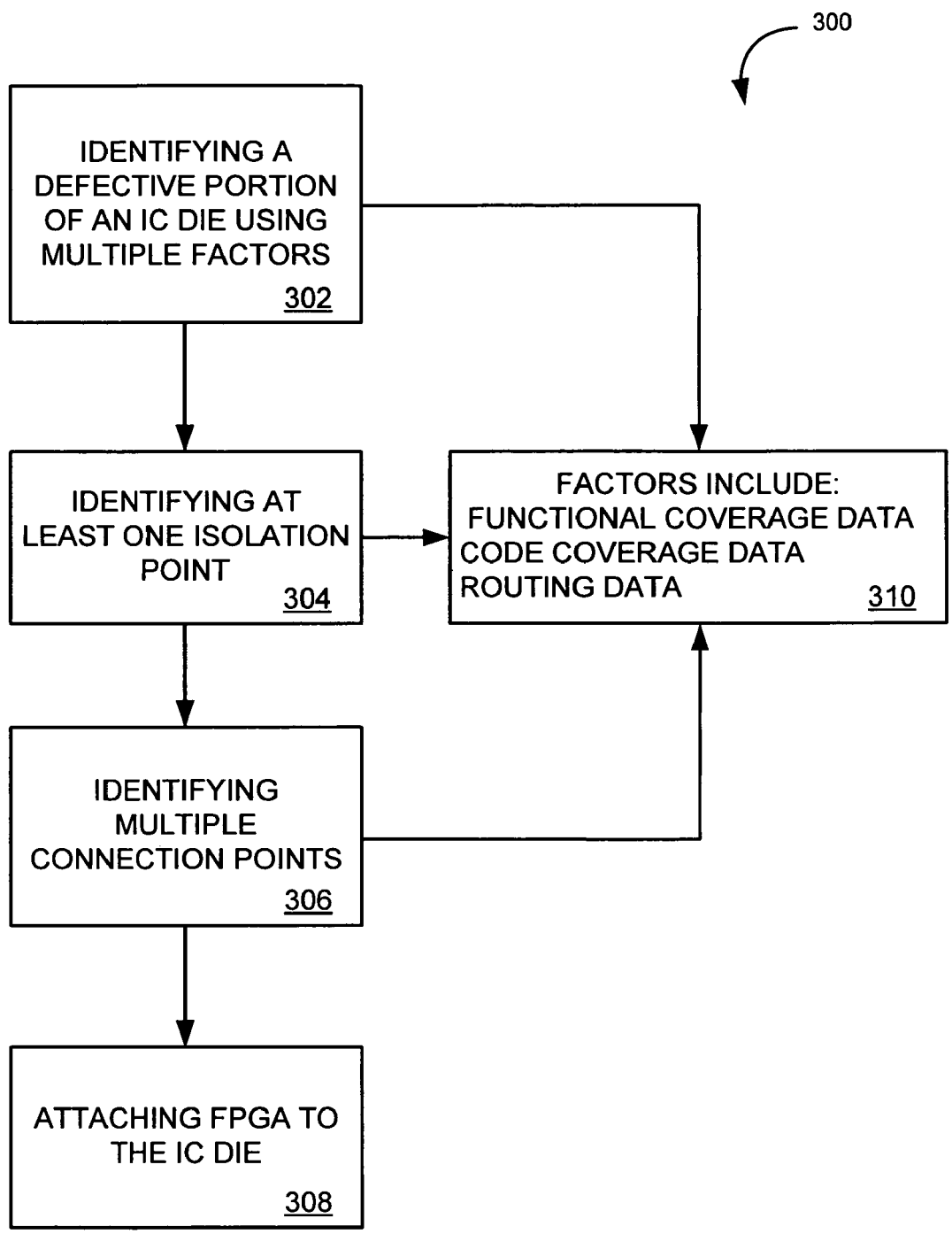
FIG. 9 is a block diagram illustrating another exemplary embodiment of a method of repairing an integrated circuit die.

Reference is now made to FIG. 9, which is a block diagram illustrating another exemplary embodiment of a method of repairing an integrated circuit die. The method 300 begins with identifying a defective portion of an IC die using multiple factors in block 302. Data corresponding to the multiple factors can be determined by accessing integrated circuit layout data. As illustrated in block 310, the factors include, but are not limited to, functional coverage data, code coverage data, and routing data. These factors can be analyzed alone or in combination using, for example, a defect analysis map.

After a defective portion of the IC die is identified, one or more isolation points are identified in block 304. The isolation points serve to isolate the defective portions of the IC die from the remaining functional portions. Identification of the isolation points may also rely on information related to the factors used to identify the defective portion. Additionally a logic map can be created for the defective portion identified in block 302 in order to properly know where to "cut" the metal layer for purposes of isolating the defective portions of the IC die. Multiple connection points are identified in block 306 so that an FPGA can be attached to the IC die in block 308. The identification of the multiple connection points may also rely on the factors used in identifying the defective portion and on the logic map that is created.

Technologies including, but not limited to, anti-fuse technology can be used to connect the FPGA to the IC die at the connection points. Related fuse technology, for example, can be utilized to cut the metal layer at locations identified as isolation points in block 304. Other types of defective logic can also be functionally repaired using the FPGA in this manner. For example defective logic that is process related such as stuck-at-1 or stuck-at-0 can be bypassed by integrating an FPGA using the methods and systems herein. In this manner the scan chains within in the chip can also be used to point out the defective areas and, possibly, the integration points. Additionally, fuse and antifuse technology embedded in the IC die at predetermined locations can be utilized to perform the connections or cuts via software.

Figure 10:
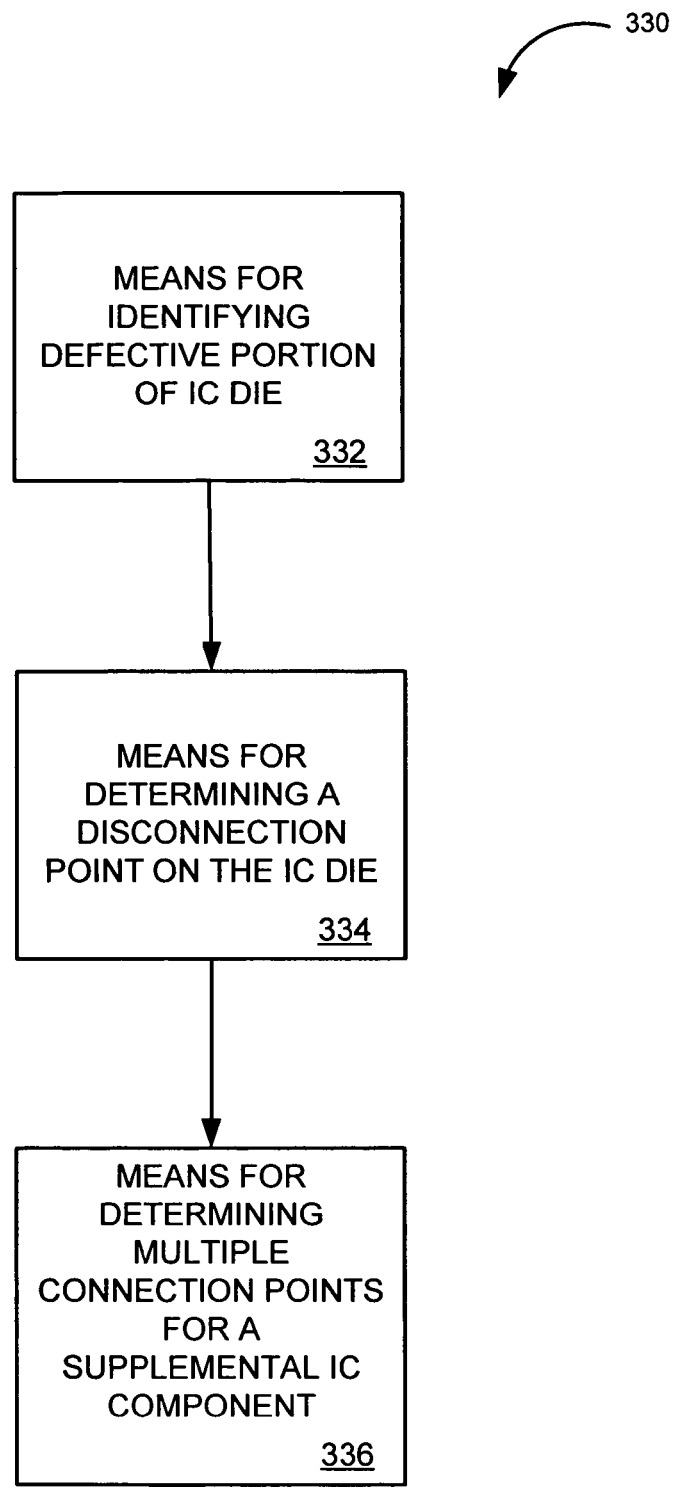
FIG. 10 is a block diagram illustrating yet another exemplary embodiment of a system of repairing an integrated circuit die.

Reference is now made to FIG. 10, which is a block diagram illustrating another exemplary embodiment of a system of repairing an integrated circuit die. The system 330 includes a means for identifying a defected portion of an IC die in block 332. The system also includes a means for determining a disconnection point on the IC die in block 334. Depending on the interconnection of the defective portion, isolating the defective portion may require identifying more than one point on the IC die. The system 330 also includes a means for determining multiple connection point for a supplemental IC component in block 336. The connection points are utilized to functionally integrate the logic of the supplemental IC component with the logic of the IC die for the purpose of replacing the functionality lost in the defective portion. The supplemental IC component can be, for example, an FPGA.

Embodiments of the present disclosure can be implemented in hardware, software, firmware, or a combination thereof. Some embodiments can be implemented in software or firmware that is stored in a memory and that is executed by a suitable instruction execution system. If implemented in hardware, an alternative embodiment can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array (PGA), a field programmable gate array (FPGA), etc.

Any process descriptions or blocks in flow charts should be understood as representing modules, segments, or portions of code which include one or more executable instructions for implementing specific logical functions or steps in the process, and alternate implementations are included within the scope of an embodiment of the present disclosure in which functions may be executed out of order from that shown or discussed, including substantially concurrently or in reverse order, depending on the functionality involved, as would be understood by those reasonably skilled in the art of the present disclosure.

The methods and systems may also comprise an ordered listing of executable instructions for implementing logical functions, which can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory. In addition, the scope of the present disclosure includes embodying the functionality of the illustrated embodiments of the present disclosure in logic embodied in hardware or software-configured mediums.

It should be emphasized that the above-described embodiments of the present disclosure, particularly, any illustrated embodiments, are merely possible examples of implementations, merely set forth for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure and the present disclosure and protected by the following claims.

The invention claimed is:

1. A method for repairing an integrated circuit device, comprising:
    identifying a defective portion of an integrated circuit device by utilizing a plurality of factors to determine a location of the defective portion, the plurality of factors including:
    functional coverage data stored in a functional coverage database;
    code coverage stored in a code coverage database; and
    routing data stored in a routing database;
    identifying, utilizing at least one of the plurality of factors, at least one isolation point configured to isolate the defective portion from the integrated circuit device;
    identifying, utilizing at least one of the plurality of factors, a plurality of connection points configured to be electrically connected to a field-programmable-gate-array; and
    attaching the field-programmable-gate-array to the integrated circuit device.

2. A method for repairing an integrated circuit device, comprising:

identifying a defective portion of an integrated circuit device, wherein the identifying is selected from the group consisting of: analyzing code coverage data, analyzing functional coverage data, analyzing power consumption data, and
analyzing routing data;
disconnecting existing circuit components; and
incorporating a supplemental integrated circuit component with the integrated circuit device.

3. The method of claim 2, wherein the identifying comprises accessing integrated circuit layout data.

4. The method of claim 2, wherein the analyzing code coverage data comprises processing logical statements designed to identify code coverage areas having an increased probability of code defects.

5. The method of claim 2, wherein the analyzing code coverage data comprises analyzing conditional instruction results to identify code coverage areas having an increased probability of code defects.

6. The method of claim 2, further comprising extracting functional coverage data using an integrated circuit analysis device to identify functional coverage areas having an increased probability of code defects.

7. The method of claim 2, wherein the analyzing power consumption data comprises identifying potential locations of defects based on high power consumption.

8. The method of claim 2, wherein the incorporating is selected from the group consisting of: electrically connecting a field-programmable-gate-array, electrically connecting an application-specific-integrated-circuit, and electrically connecting a programmable-gate-array.

9. The method of claim 8, wherein the incorporating further comprises programming the field-programmable-gate-array to replace the defective portion.

10. The method of claim 2, wherein the disconnecting comprises creating an electrical open circuit between a first element and a second element on the integrated circuit device.

11. The method of claim 2, wherein the identifying comprises evaluating a combination of a plurality of factors utilizing a graphical representation including a corresponding plurality of axes.

12. The method of claim 11, wherein the plurality of factors are selected from the group consisting of: power consumption data, functional coverage data, code coverage data, and routing data.

13. The method of claim 12, wherein the evaluating further comprises plotting location points of the integrated circuit device corresponding to each of the plurality of axes.

14. The method of claim 13, wherein an integrated circuit device location having a high probability of including the defective portion comprises a portion of the integrated circuit device corresponding to low code coverage relative to other primary integrated circuit device locations and low functional coverage relative to other primary integrated circuit device locations.

15. A system for repairing an integrated circuit device, comprising:
detection logic configured to locate a defective portion of an integrated circuit device, wherein the detection logic utilizes a plurality of factors to locate the defective portion, the plurality of factors selected from the group consisting of: layout data corresponding to the integrated circuit device, functional coverage data, code coverage data, routing data, and power consumption data;
a supplemental integrated circuit component configured to functionally replace the defective portion; and
logic configured to identify an interface location.

16. The system of claim 15, wherein the interface location comprises a plurality of connection points on the integrated circuit device for connecting the supplemental integrated circuit component.

17. The system of claim 15, wherein the interface location comprises a disconnect location where the defective portion can be isolated from the integrated circuit device.

18. The system of claim 15, wherein the supplemental integrated circuit component is selected from the group consisting of: a field-programmable-gate array, an application-specific-integrated-circuit, and a programmable gate array.

19. The system of claim 15, further comprising a circuit analysis device configured to extract the functional coverage data.

20. The system of claim 15, further comprising a plurality of assertion instructions configured to provide functional coverage data.

21. The system of claim 15, further comprising a plurality of logical statements configured to identify code coverage data corresponding to a plurality of locations on the integrated circuit device.

22. The system of claim 21, wherein some of the plurality of logical statements comprise branch instructions.

23. The system of claim 15, further comprising a database containing performance information corresponding to the integrated circuit device.

24. The system of claim 23, wherein the performance information is selected from the group consisting of: layout data, code coverage data, routing data, functional coverage data, and power consumption data.

25. A system for repairing an integrated circuit device, comprising:
means for identifying a defective portion of an integrated circuit device, wherein the means for identifying a defective portion utilizes a plurality of factors to locate the defective portion, the plurality of factors comprising:
layout data corresponding to the integrated circuit device,
functional coverage data describing functionality of operations designed into the integrated circuit device,
code coverage data characterizing a measure of effectiveness of a test program to check lines of code,
routing data, and
power consumption data;
means for determining a disconnection point on the integrated circuit device to isolate the defective portion; and
means for determining a plurality of connection points on the integrated circuit device for connecting a supplemental integrated circuit component.

* * * * *